(12) United States Patent
Shetty et al.

(10) Patent No.: US 11,978,528 B2
(45) Date of Patent: May 7, 2024

(54) DYNAMIC SENSING LEVELS FOR NONVOLATILE MEMORY DEVICES

(71) Applicant: Infineon Technologies LLC, San Jose, CA (US)

(72) Inventors: Shivananda Shetty, San Jose, CA (US); Yoram Betser, Mazkeret Batya (IL); Pawan Singh, San Jose, CA (US); Stefano Amato, Mountain View, CA (US); Alexander Kushnarenko, Haifa (IL)

(73) Assignee: Infineon Technologies LLC, San Jose, CA (US)

(*) Notice: Subject to any disclaimer, the term of this patent is extended or adjusted under 35 U.S.C. 154(b) by 0 days.

(21) Appl. No.: 17/649,326

(22) Filed: Jan. 28, 2022

(65) Prior Publication Data

US 2023/0119194 A1    Apr. 20, 2023

Related U.S. Application Data

(60) Provisional application No. 63/256,126, filed on Oct. 15, 2021.

(51) Int. Cl.
*G11C 7/06* (2006.01)
*G11C 7/10* (2006.01)
*G11C 7/12* (2006.01)

(52) U.S. Cl.
CPC ............ *G11C 7/062* (2013.01); *G11C 7/1048* (2013.01); *G11C 7/1069* (2013.01); *G11C 7/1096* (2013.01); *G11C 7/12* (2013.01)

(58) Field of Classification Search
CPC ...... G11C 7/062; G11C 7/1048; G11C 7/1069; G11C 7/1096; G11C 7/12
USPC ......................................... 365/189.07
See application file for complete search history.

(56) References Cited

U.S. PATENT DOCUMENTS

| | | | |
|---|---|---|---|
| 9,773,529 B1 * | 9/2017 | Danon ............... | G11C 7/062 |
| 2003/0179632 A1 | 9/2003 | Nishimura et al. | |
| 2013/0322154 A1 | 12/2013 | Youn et al. | |
| 2015/0340098 A1 * | 11/2015 | Maayan ............... | G11C 8/10 |
| | | | 365/185.2 |

(Continued)

OTHER PUBLICATIONS

International Search Report and Written Opinion for International Application No. PCT/US22/46695 15 Pages dated Feb. 15, 2023.

*Primary Examiner* — Huan Hoang

(57) ABSTRACT

Systems, methods, and devices dynamically determine sensing levels for memory devices. Devices include nonvolatile memory cells included in a plurality of memory sectors, a plurality of static reference cells configured to represent a first reference value for distinguishing between memory states, and a plurality of dynamic reference cells configured to represent the first reference value after a designated amount of memory sector activity. Devices also include a comparator configured to be coupled to at least one memory cell of the plurality of memory cells and to at least two of the plurality of static reference cells and the plurality of dynamic reference cells, and further configured to determine a memory state of the at least one memory cell based, at least in part, on a second reference value determined by a combination of at least two of the plurality of static reference cells and the plurality of dynamic reference cells.

20 Claims, 8 Drawing Sheets

(56) References Cited

U.S. PATENT DOCUMENTS

2017/0345509 A1 11/2017 Tran et al.
2020/0303002 A1 9/2020 Miyazaki

* cited by examiner

DYNAMIC SENSING LEVELS FOR NONVOLATILE MEMORY DEVICES

CROSS-REFERENCE TO RELATED APPLICATIONS

This application claims the benefit under 35 U.S.C. § 119(e) of U.S. Provisional Patent Application No. 63/256,126, filed on Oct. 15, 2021, which is incorporated herein by reference in its entirety for all purposes.

TECHNICAL FIELD

This disclosure generally relates to memory devices, and more specifically, to dynamic sensing levels associated with such memory devices.

BACKGROUND

Memory devices may use memory cells in memory arrays to store data values. Such memory arrays may include word lines and bit lines to identify and select such memory cells in memory arrays. Furthermore, reference cells may be used to store reference values used to identify what value may be stored in a particular memory cell. As such memory cells undergo multiple program and erase operations, their operational characteristics may change due to changes in conductive properties. Accordingly, conventional memory devices remain limited because as they age and operational characteristics of memory cells change, bit errors occur due to such changes in operational characteristics.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

Memory devices may include nonvolatile memory cells that undergo multiple program and erase operations over the lifetime of such memory devices. Accordingly, a current distribution associated with such program and erase operations may drift and increase over time. Accordingly, a reference voltage, which may be used to distinguish one memory state from another, or a programmed state from an erased state, may yield accurate results initially, but as drift sets in, the reference voltage may no longer be accurate. For example, a static reference value may initially be selected such that a current distribution associated with a program operation is below the static reference value, and a current distribution associated with an erase operation is above the static reference value. As drift sets in, and the values of the distributions increase, the current distribution of the program operation may shift sufficiently far up that part of the distribution is not greater than the static reference value. When this occurs, since at least some of both program operation and erase operation distributions are above the static reference value, the static reference value is no longer able to distinguish between the two, and bit errors may occur.

Embodiments disclosed herein provide the ability to dynamically determined reference levels used in sensing operations. As will be discussed in greater detail below, a combination of static and dynamic reference cells may be used to represent a reference voltage level that tracks changes in memory cell operational characteristics over time. Moreover, multiple groups of reference cells may be used in combination to reduce variability of the reference voltage, and increase the accuracy with which the reference voltage is represented. In this way, the accuracy of the reference voltage in its ability to model drift or changes of the operational characteristics of the memory cells is increased, and accuracy of sensing operations and memory state determinations is also increased. In this way, bit error rates may be reduced, and longevity of the memory device may be increased.

Figure 1:
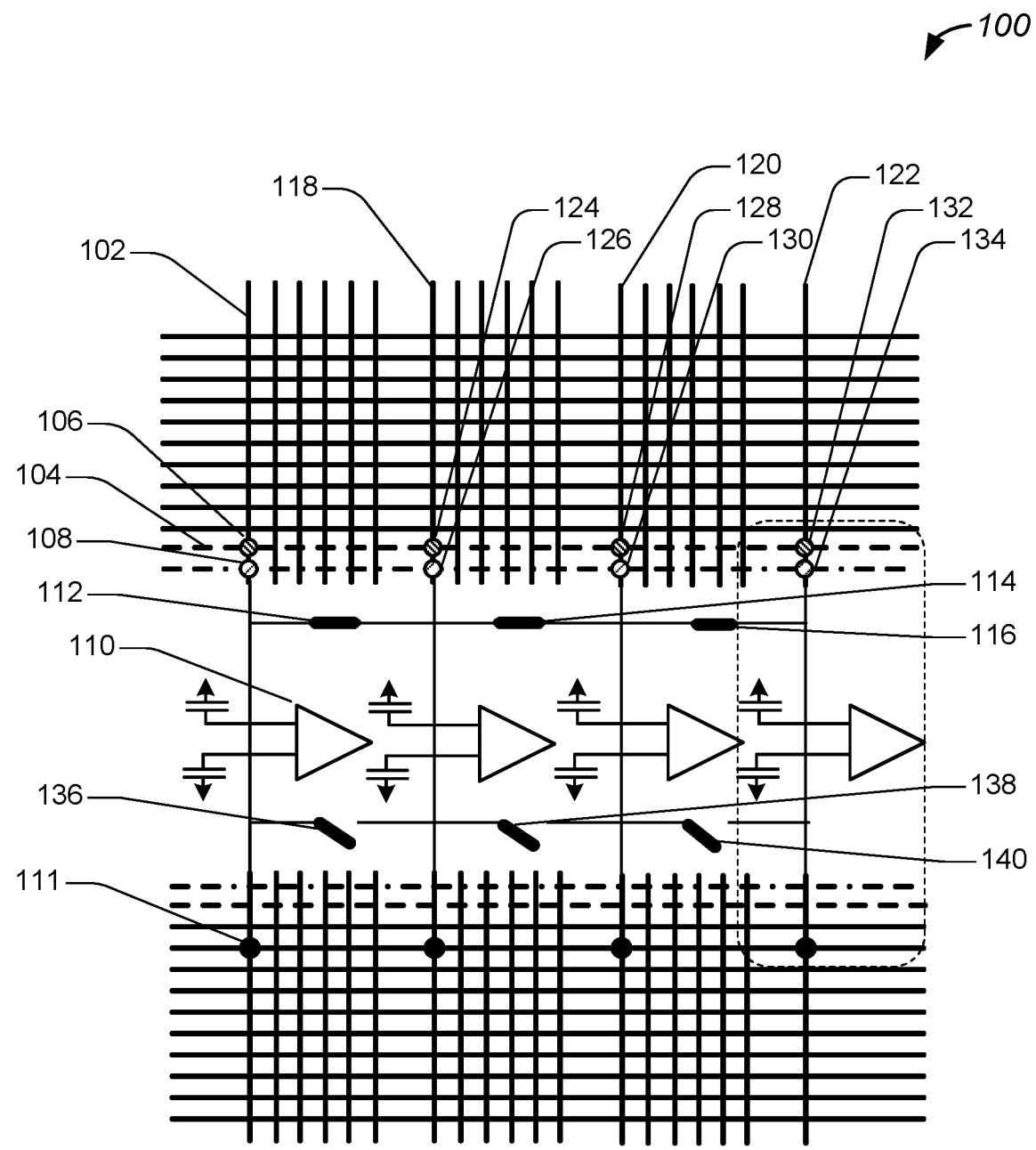
FIG. 1 illustrates an example of a device for dynamic sensing level determination, configured in accordance with some embodiments.

FIG. 1 illustrates an example of a device for dynamic sensing level determination, configured in accordance with some embodiments. As will be discussed in greater detail below, a memory device, such as device 100, may include various memory cells that may be programmed to memory states. More specifically, conductive properties of the memory cells may be configured to represent memory states, and sensing operations may be performed to identify or read such memory states. As will also be discussed in greater detail below, a sensing level used in such sensing operations may be determined dynamically to compensate for changes that may occur due to ageing and/or usage of the memory cells.

In various embodiments, device 100 includes various bit lines and word lines, such as bit line 102 and word line 104. As shown in FIG. 1, bit lines and word lines may intersect at memory cells, and may thus be configured to select particular memory cells based on an intersection of a selected bit line and a selected word line. Such memory cells may be metal-oxide-semiconductor field-effect transistor (MOSFET) devices, and may have threshold voltages that are changed or modified to represent memory states. In various embodiments, memory cells and/or reference cells may be in a one-transistor (1T) configuration, two-transistors (2T) configuration, or split gate (1.5T) configuration, or a combination thereof. For example, a threshold voltage may be set for a particular MOSFET device, and may be sensed and compared against a reference level to determine a data value has been programmed and stored. More specifically, if the threshold voltage is greater than the reference level, it may represent a first memory state. Moreover, if the threshold voltage is less than the reference level, it may represent a second memory state. For example, a higher conductance (e.g. higher cell current) and lower threshold voltage may represent an erased state, and a lower conductance and a higher threshold voltage may represent a programmed state. Additional details regarding such comparisons with reference levels are discussed in greater detail below.

In various embodiments, the memory cells included in device 100 are arranged in subunits, also referred to herein as memory sectors. Thus, memory cells in device 100 may be managed in multiple different sectors, and device 100 may include hundreds of memory sectors.

Device 100 further includes various reference cells, such as first reference cell 106 and second reference cell 108. As will be discussed in greater detail below, the reference cells may be used to determine reference voltages used for the determination of memory states discussed above. Accordingly, voltages stored by first reference cell 106 and second reference cell 108 may be used to determine a reference level, also referred to herein as a reference voltage, for a particular sensing operation for a particular memory cell associated with those reference cell. Additional details regarding such sensing operations are discussed in greater detail below.

In various embodiments, first reference cell 106 is a static reference cell that is configured to have a current distribution that is in between a current distribution of a program operation and a current distribution of an erase operation. Accordingly, the current distribution and corresponding reference voltage of the static reference cell is bounded by the current distributions of the program and erase operations. Thus, a mean and sigma, or variance, term of the reference current distribution for static reference cells stays substantially constant over the lifetime of device 100.

In various embodiments, second reference cell 108 is a dynamic reference cell that is configured to have a current distribution that adjusts based on an age of the memory cells over the lifetime of device 100. Thus, in various embodiments, the dynamic reference cells may be programmed and erased along with their corresponding memory cells to accurately track changes that occur due to such program and erase operations. Such changes may include an increase in program and erase currents used for program and erase operation as the memory cells age. Thus, the current distribution of a dynamic reference cell may be dynamic and may change over time. Accordingly, dynamic reference cells are tied to memory sector activity and have a reference voltage that changes over time, while static reference cells are not tied to memory sector activity, and do not change over time as much as the dynamic reference cells. As will be discussed in greater detail below, a reference level may be determined using a combination of the static and dynamic reference cells.

Device 100 additionally includes sense amplifier 110 which is configured to perform sense operations discussed above. More specifically, sense amplifier 110 may be an operational amplifier that has one input terminal coupled to a memory cell, such as memory cell 111, and another input terminal tied to one or more reference cells. In this way, sense amplifier 110 may compare a sensed voltage of the memory cell with a reference voltage determined by one or more reference cells, as will be discussed in greater detail below. Moreover, sense amplifier 110 may be included in or coupled to a comparator to perform memory state determinations.

Device 100 further includes various switches, such as switch 112. In various embodiments, the switches are configured to selectively couple various bit lines together to average the voltages represented by reference cells on those bit lines. More specifically, as shown in FIG. 1, switch 112, switch 114, and switch 116 are closed, and couple bit line 102, bit line 118, bit line 120, and bit line 122. As also shown in FIG. 1, bit line 102 is coupled to first reference cell 106 and second reference cell 108, bit line 118 is coupled to third reference cell 124 and fourth reference cell 126, bit line 120 is coupled to fifth reference cell 128 and sixth reference cell 130, and bit line 122 is coupled to seventh reference cell 132 and eighth reference cell 134.

As shown in FIG. 1, switches 112, 114, and 116 are closed to average the reference voltages on bit lines 102, 118, 120, and 122. As will be discussed in greater detail below, each dynamic reference cell may have a relatively large variance in its reference voltage/current due to differences in characteristics of MOSFET devices, as well as differences in corresponding sector activity. The averaging of such reference voltages may substantially reduce the variance in reference voltages/currents, thus prolonging the life and operation of device 100. As shown in FIG. 1, complimentary switches, such as switches 136, 138, and 140 are open.

It will be appreciated that while FIG. 1 illustrates four sets of reference cells being used in combination, any number of sets may be used. For example, eight sets of reference cells may be used to further reduce a variance in reference voltages and currents. For example, a variance of a reference current for a single pair of static and dynamic reference cells may be given by equation 1 shown below:

$$\sigma = (\sigma_S^2 + \sigma_D^2)^{0.5} \quad (1)$$

When used in combination, the averaging of reference currents may reduce a total variance. For example, a capacitive averaging of 4 pairs of static and dynamic reference cells may further reduce variance as shown in equation 2 shown below:

$$\sigma = ((\sigma_S^2 + \sigma_D^2)^{0.5})/2 \quad (2)$$

Moreover, a capacitive averaging of 8 pairs of static and dynamic reference cells may even further reduce variance as shown in equation 3 shown below:

$$\sigma = ((\sigma_S^2 + \sigma_D^2)^{0.5})/2.8 \quad (3)$$

In some embodiments, the number of sets of reference cells used may be updated and changed dynamically over the life of device 100. For example, after a designated number of program and/or erase operations, eight sets of reference cells may be used instead of four. In this way, a number of sets of reference cells may be selected dynamically to further improve the efficiency and longevity of device 100.

Figure 2:
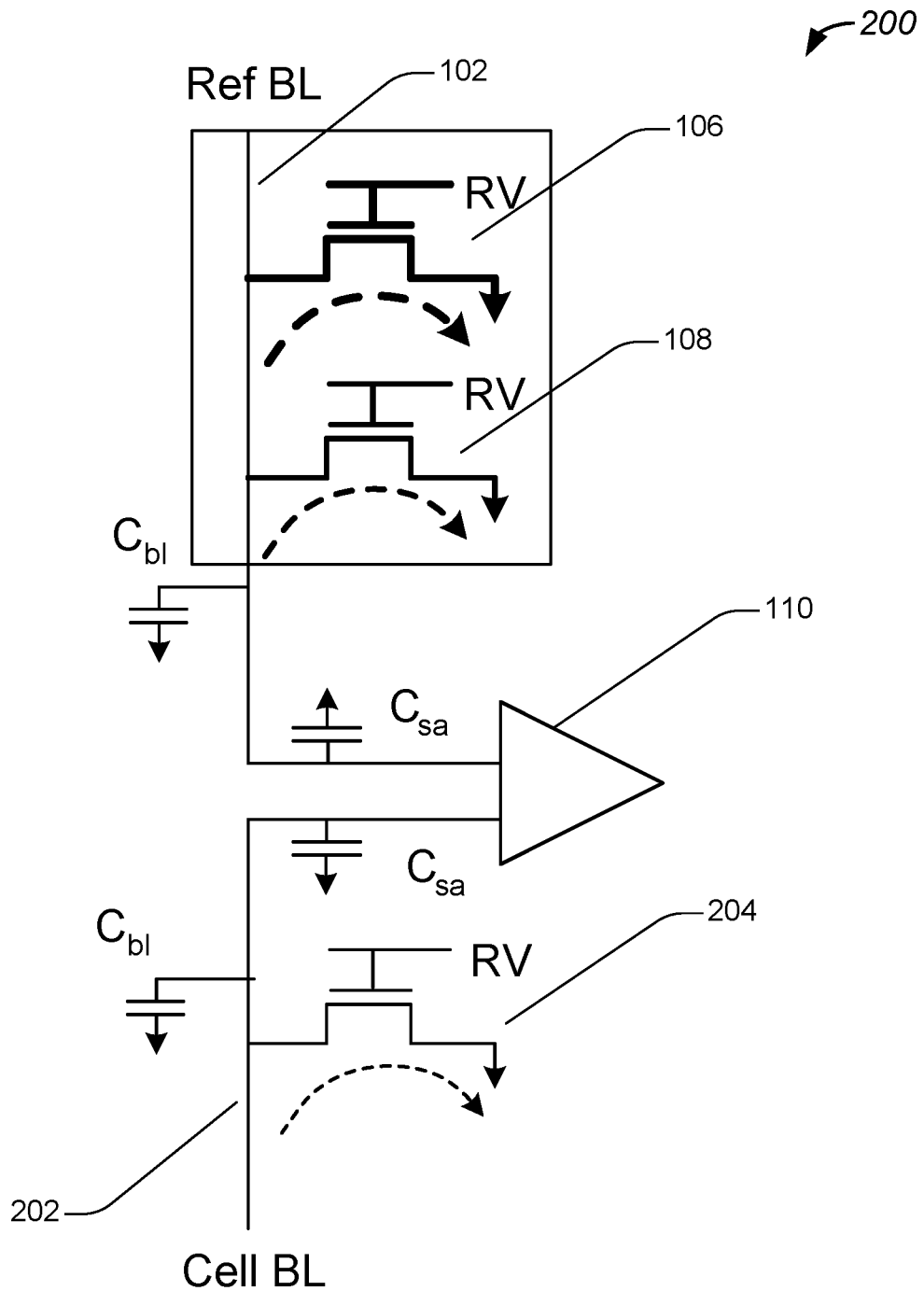
FIG. 2 illustrates an example of another device for dynamic sensing level determination, configured in accordance with some embodiments.

FIG. 2 illustrates an example of another device for dynamic sensing level determination, configured in accordance with some embodiments. As similarly discussed above, a memory device, such as device 200, may include various memory cells that may be programmed to store memory values. As will also be discussed in greater detail below, a reference level used in such sensing operations may be determined dynamically to compensate for changes that may occur due to ageing and/or usage of the memory cells. More specifically, combinations of reference cells may be used to determine reference voltages for sensing operations while also compensating for variances of such reference cells.

In various embodiments, device 200 includes first reference cell 106, second reference cell 108, and sense amplifier 110, as discussed above with reference to FIG. 1. As shown in FIG. 2, first reference cell 106 and second reference cell 108 are coupled to bit line 102, and bit line 102 is coupled to an input terminal of sense amplifier 110. Moreover, as denoted in FIG. 2, multiple sets of reference cells may be coupled to the input terminal of sense amplifier 110 via one or more switches, as discussed above with reference to FIG. 1. Furthermore, additional bit line 202 is coupled to memory cell 204, and is also coupled to an additional input terminal of sense amplifier 110.

In some embodiments, four sets of reference cells are coupled to the input terminal of sense amplifier 110. Accordingly, a reference voltage may be determined based on equation 4 shown below:

$$V_{ref} = V_{pre\_charge} - \frac{I_{ref\_av} * t_{sense}}{C_{bl} + C_{sa}} \quad (4)$$

In equation 4, $V_{pre\_charge}$ may be a pre-charging voltage used to charge memory cells that are to be read during a sensing operation. Accordingly, $V_{pre\_charge}$ is a designated voltage known to device 200. Similarly, $t_{sense}$ as well as $C_{bl}$ and $C_{sa}$ may be known to device 200, or may be determined based on measured behavior of a bit line and/or a sense amplifier. In various embodiments, the capacitance and time values are determined during a design process. For example, known values, such as $C_{bl}$ and $C_{sa}$, may be determined by a manufacturer using a simulation tool, such as SPICE. Moreover, a timing value, such as $t_{sense}$, may be determined during a manufacturing process by a manufacturer to meet a timing specification or performance parameter. In equation 4, additional clarification of $I_{ref\_av}$ is given by equation 5 shown below:

$$I_{ref\_av} = \sum \left( \frac{I_{ref\_st} + I_{ref\_dyn}}{4} \right) \quad (5)$$

Accordingly, $I_{ref\_av}$ is determined by averaging measured currents of each of the pairs of reference cells, and that averaged current measurement may be used to determine a reference voltage based on equation 4 referenced above. In this way, measurements of sets of reference cells may be used to determine reference currents and a reference voltage that is then provided to an input terminal of a sense amplifier, such as sense amplifier 110. As shown in FIG. 2, this reference voltage may be compared with a measured current and voltage obtained from memory cell 204 coupled to another input terminal of sense amplifier 110 via bit line 202, and the output of sense amplifier 110 may provide a result of the sense operation, and a representation of the memory state stored in memory cell 204.

It will be appreciated that embodiments disclosed herein may use different combinations of configurations of static reference cells and dynamic reference cells. As discussed above, a set or group of reference cells may include four static reference cells and four dynamic reference cells. In one example, all four static reference cells may be programmed to the same reference voltage and reference current/conductance. In various embodiments, programming and erasing operations described herein may refer to full programming and full erasing. Moreover, the dynamic reference cells may also all be programmed in accordance with a program operation of device 200. In another example, all four static reference cells may be programmed to the same reference voltage, while some dynamic reference cells are programmed and one or more dynamic reference cells are left in an erased state. In yet another example, all four static reference cells may be programmed to the same reference voltage, while one or more, or all of the dynamic reference cells may be partially programmed or partially erased. In an additional, all four static reference cells may be programmed to the same reference voltage, and the dynamic reference cells might be disabled and not used during averaged reference voltage determination. Accordingly, different implementations of static and dynamic reference cells may be used to configure reference current behavior to track behavior of memory cells with improved accuracy.

Figure 3:
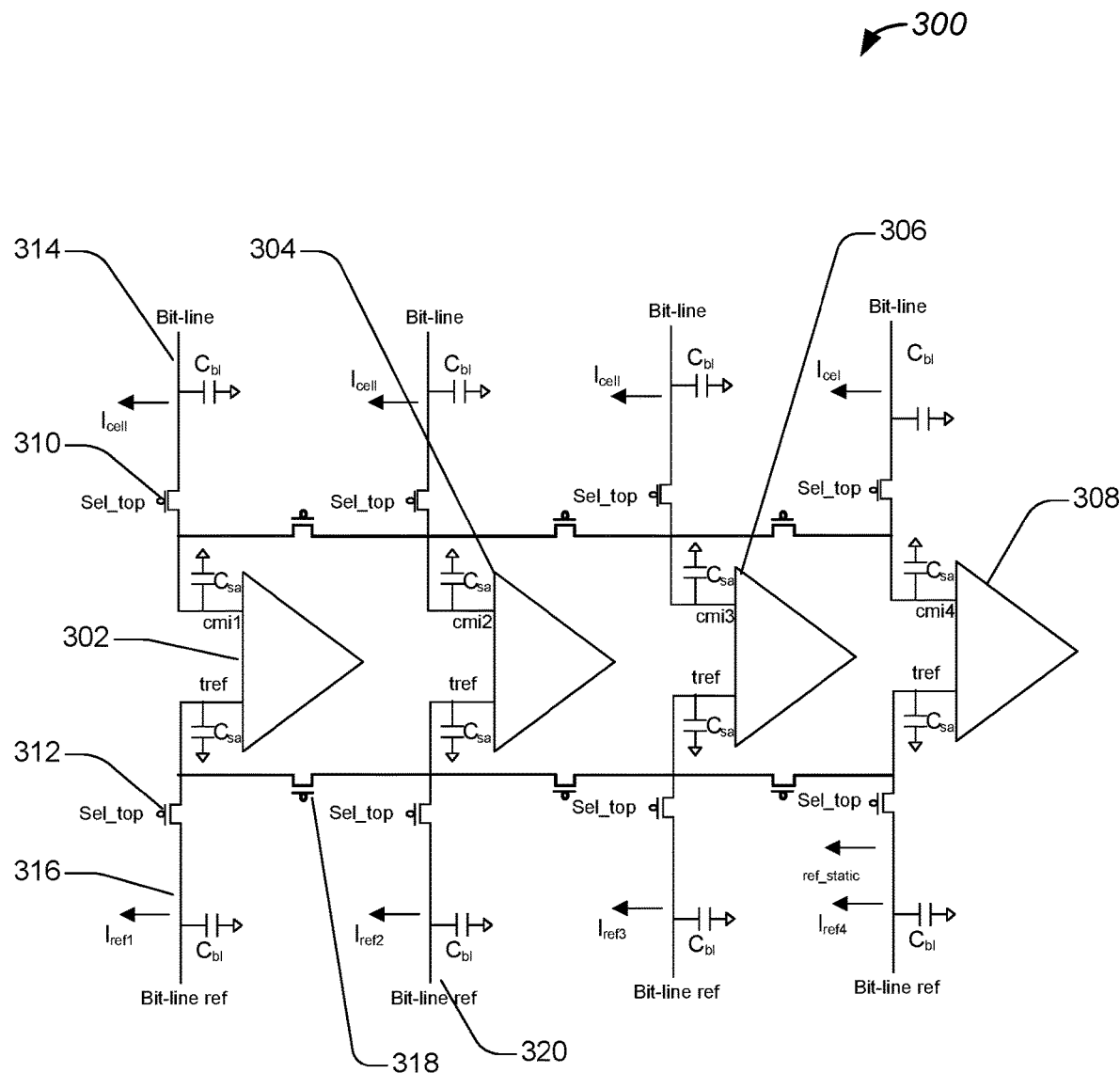
FIG. 3 illustrates an example of yet another device for dynamic sensing level determination, configured in accordance with some embodiments.

FIG. 3 illustrates an example of yet another device for dynamic sensing level determination, configured in accordance with some embodiments. As similarly discussed above, a memory device, such as device 300, may include various memory cells that may be programmed to store memory values as well as associated reference cells. As will be discussed in greater detail below, transistors may be used to implement bit line selection logic as well as the switches discussed above.

Accordingly, device 300 may include various sense amplifiers, such as sense amplifier 302, amplifier 304, amplifier 306, and amplifier 308. The sense amplifiers may be coupled to various bit lines of mirrored memory sectors, as well as their associated memory cells and reference cells. As shown in FIG. 3, transistors, such as first transistor 310 and second transistor 312, may be used to selectively couple bit lines, such as bit line 314 and bit line 316, to a sense amplifier, such as sense amplifier 302. Moreover, various transistors, such as third transistor 318, may be used to couple bit lines, such as bit line 316 and bit line 320, to each other. In this way, various selection transistors may be used to implement the current and measurement averaging discussed above. In various embodiments, the operation of the selection logic as well as other transistors may be controlled by a device or system components, such as a memory controller.

Figure 4:
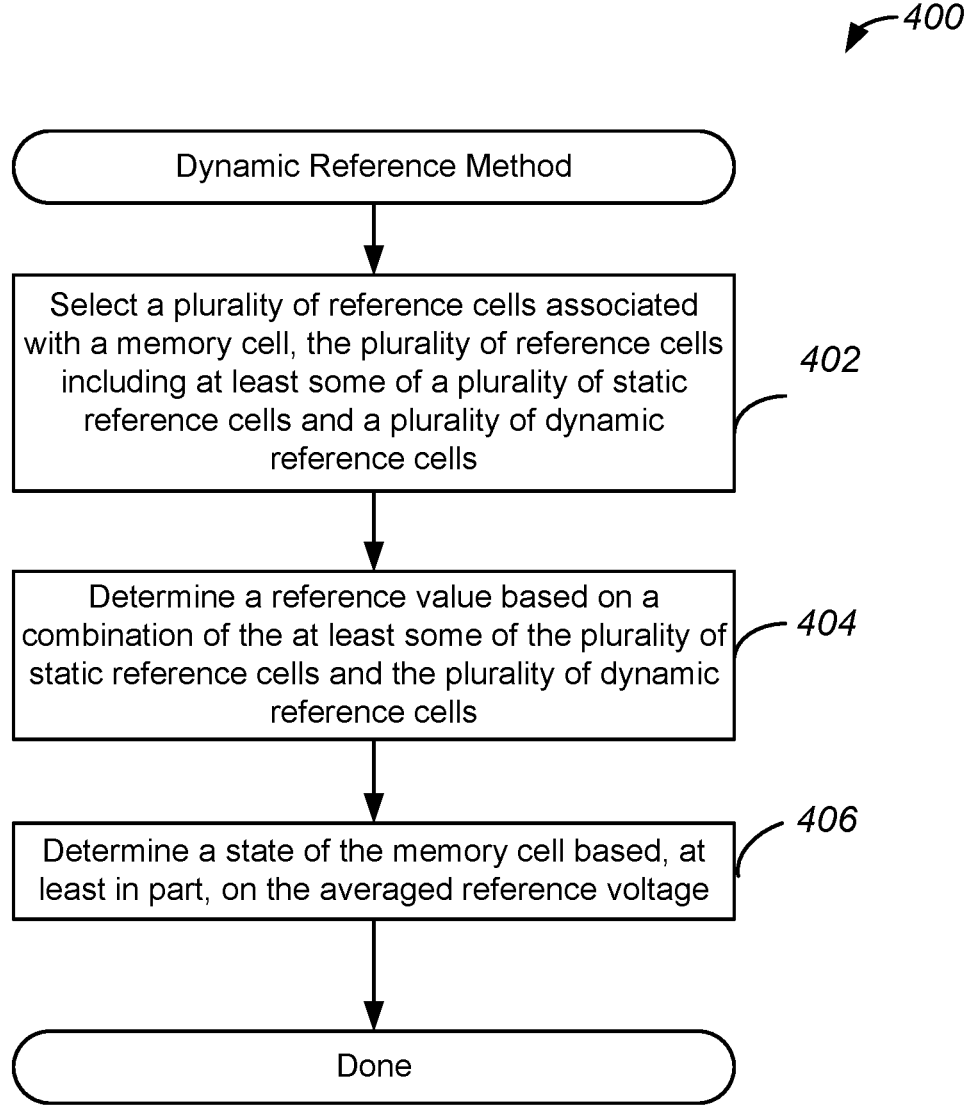
FIG. 4 illustrates an example of a method for dynamic sensing level determination, configured in accordance with some embodiments.

FIG. 4 illustrates an example of a method for dynamic sensing level determination, configured in accordance with some embodiments. As similarly discussed above, various memory cells may be programmed to store memory values. Moreover, a method, such as method 400, may be performed to dynamically determined reference levels used for read operations performed on such memory cells. In this way, a reference level used in such sensing operations may be determined dynamically to compensate for changes that may occur due to ageing and/or usage of the memory cells.

Method 400 may perform operation 402 during which a plurality of reference cells may be selected. As similarly discussed above, the plurality of reference cells may include one or more sets of reference cells. Moreover, the reference cells may include static reference cells and dynamic reference cells. Accordingly, during operation 402, a group or set of reference cells may be selected, and one or more switches may be configured to couple bit lines of the identified reference cells. In various embodiments, the reference cells are identified based on a particular memory cell that has been identified for a read or sense operation. Accordingly, associated reference cells may be identified based on a designated mapping and/or complimentary addressing scheme used in mirror memory sectors.

Method 400 may perform operation 404 during which a reference value may be determined. Accordingly, as will be discussed in greater detail below, a voltage may be applied to the bit lines associated with the reference cells as well as the memory cells. The cells may be activated to discharge the voltage, thus resulting in one or more discharge currents. As will be discussed in greater detail below, the coupling of the switches may couple the bit lines of the reference cells to each other, thus averaging a discharge current for the selected reference cells, and resulting in a reference value seen by an input terminal of the sense amplifier coupled to the reference cells.

Method 400 may perform operation 406 during which a memory cell state may be determined based, at least in part, on the averaged reference voltage. As discussed above, the transistors underlying the reference cells and the memory cell may be turned on, and the sense amplifier may determine if the reference cells or the memory cell discharge faster, and may implement a corresponding voltage comparison. A memory state of the memory cell may be determined based on a result of the discharge behavior, as may be inferred from the conductance behavior discussed above as it relates to programmed and erased states. More specifically, a voltage of the memory cell being above the averaged reference voltage may identify a first memory state, and a voltage of the memory cell being below the averaged reference voltage may identify a second memory state. As noted above, the discharge current of the reference cells is capacitively averaged, thus dramatically reducing individual variance of the reference cells, and enabling greater accuracy and reduced error rate of the memory state determination.

Figure 5:
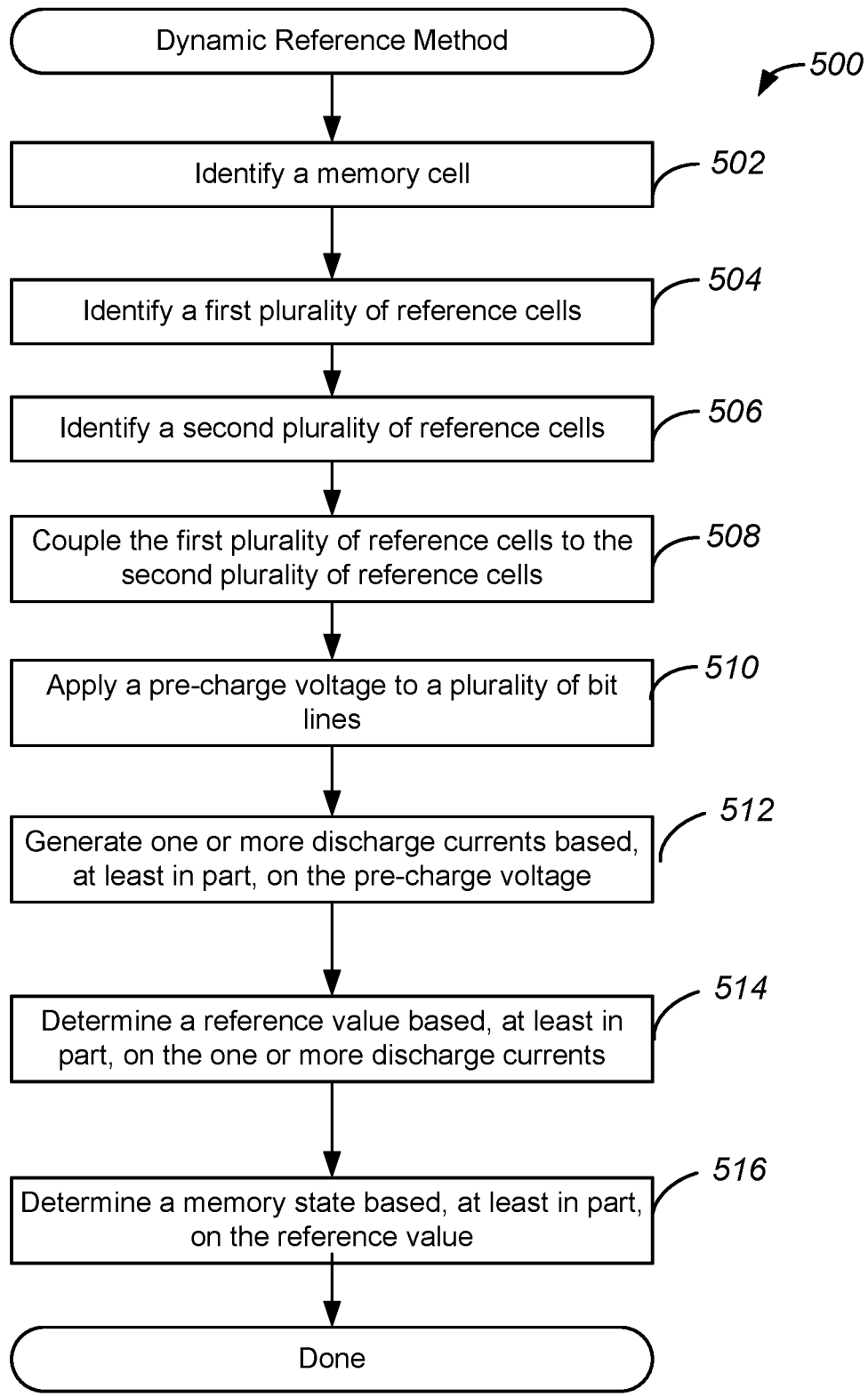
FIG. 5 illustrates an example of another method for dynamic sensing level determination, configured in accordance with some embodiments.

FIG. 5 illustrates an example of another method for dynamic sensing level determination, configured in accordance with some embodiments. As similarly discussed above, reference levels may be dynamically determined for read operations performed on such memory cells. Accordingly, a method, such as method 500, may be performed to identify and select particular reference cells for a particular memory cell, and utilize multiple reference cells for a single memory cell. In this way, a reference level used in such sensing operations may be determined dynamically to compensate for changes that may occur due to ageing and/or usage of the memory cells.

Method 500 may perform operation 502 during which a memory cell may be identified. In various embodiments, the identified memory cell may be a memory cell that has been identified for a read operation or other memory operation. Accordingly, the memory cell may be identified as part of operation of a memory device. In one example, the memory cell may be identified based on one or more identifiers or data values included in a memory access request.

Method 500 may perform operation 504 during which a first plurality of reference cells may be identified. In various embodiments, the first plurality of reference cells includes static reference cells and dynamic reference cells. For example, the reference cells may include a static reference cell and dynamic reference cell included on a complimentary bit line as the identified memory cell. Accordingly, the memory cell may be included in a mirrored architecture, as discussed above. The static reference cell and the dynamic reference cell may be identified based on the complimentary relationship of the cells and/or a predetermined mapping stored in memory.

Method 500 may perform operation 506 during which a second plurality of reference cells may be identified. The second plurality of reference cells includes additional static reference cells and dynamic reference cells that will be used in combination with the first plurality of static reference cells and dynamic reference cells, as similarly discussed above. More specifically, additional reference cells may be identified during operation 506 that will be used for current averaging and variance reduction of the reference values. It will be appreciated that while operation 504 and 506 have been describes separately, they may be performed simultaneously and/or part of the same operation. Accordingly, operation 504 and 506 may be combined and performed as a single operation.

In some embodiments, the second plurality of static reference cells and dynamic reference cells may be identified based, at least in part, on a designated mapping or set of rules. For example, a static reference cell and a dynamic reference cell may be identified for a next three bit lines based on a designated number of bit lines that may have been determined during a configuration process of the memory device. In this way, one or more predetermined rules may be used to identify the additional reference cells. In various embodiments, the second plurality of reference cells may be identified based on logic implemented in firmware. In some embodiments, the second plurality of reference cells are identified based on programable software. It will be appreciated that the second plurality of reference cells may be any suitable number of reference cells.

Method 500 may perform operation 508 during which the first plurality of static memory cells and reference cells is coupled to the second plurality of static memory cells and reference cells. Accordingly, switches may be closed to couple the bit lines to each other, and also couple terminals of the reference cells together. As discussed above, the reference cells may also be coupled to an input terminal of a sense amplifier associated with the identified memory cell. In this way, the reference cells may be coupled to a first input terminal of the sense amplifier, and the identified memory cell may be coupled to a second input terminal of the same sense amplifier.

Method 500 may perform operation 510 during which a pre-charge voltage is applied to a plurality of bit lines. Accordingly, a voltage may be applied to the bit lines to charge them to a predetermined voltage. As discussed above, the pre-charge voltage is a predetermined voltage that may be used for scanning operations, as well as other memory operations.

Method 500 may perform operation 512 during which one or more discharge currents may be generated. Accordingly, the gates of the reference cells and the memory cell may be opened or activated, and the charged voltage may be discharged via the transistors underlying the reference cells and memory cell. As discussed above, the discharge current may be averaged for the selected reference cells because they are coupled with each other via the switches, and one or more capacitances, such as a bit line capacitance and a sense amplifier capacitance, may further provide capacitive averaging. As also discussed above with reference to equations 1-3, because they are coupled together and their currents are capacitively averaged, their individual variances are reduced.

Method 500 may perform operation 514 during which a reference value may be determined. Accordingly, reference value will appear at a bit line coupled to an input terminal of the sense amplifier as a result of the averaged discharge currents. Thus, a reference value may be determined that corresponds to a capacitive averaging of the discharge currents. In this way, variance of the reference voltage represented by reference cells is also reduced, and accuracy of the determination and application of a dynamic reference voltage is improved thus resulting in lower bit error rates and increased longevity of memory devices disclosed herein.

Method 500 may perform operation 516 during which a memory state may be determined based, at least in part, on the reference value. As similarly discussed above, the speed with which the voltage and current discharges will affect an output of the sense amplifier, and provide an indication of whether or not the memory cell has a higher or lower conductance/threshold voltage than the reference cells, and accordingly, whether or not the memory cell is in a programmed or erased state. More specifically, if the voltage of the memory cell is lower than the averaged reference voltage, it may be determined that the memory cell is in an erased state. If the voltage of the memory cell is higher than the averaged reference voltage, it may be determined that the memory cell is in a programmed state.

Figure 6:
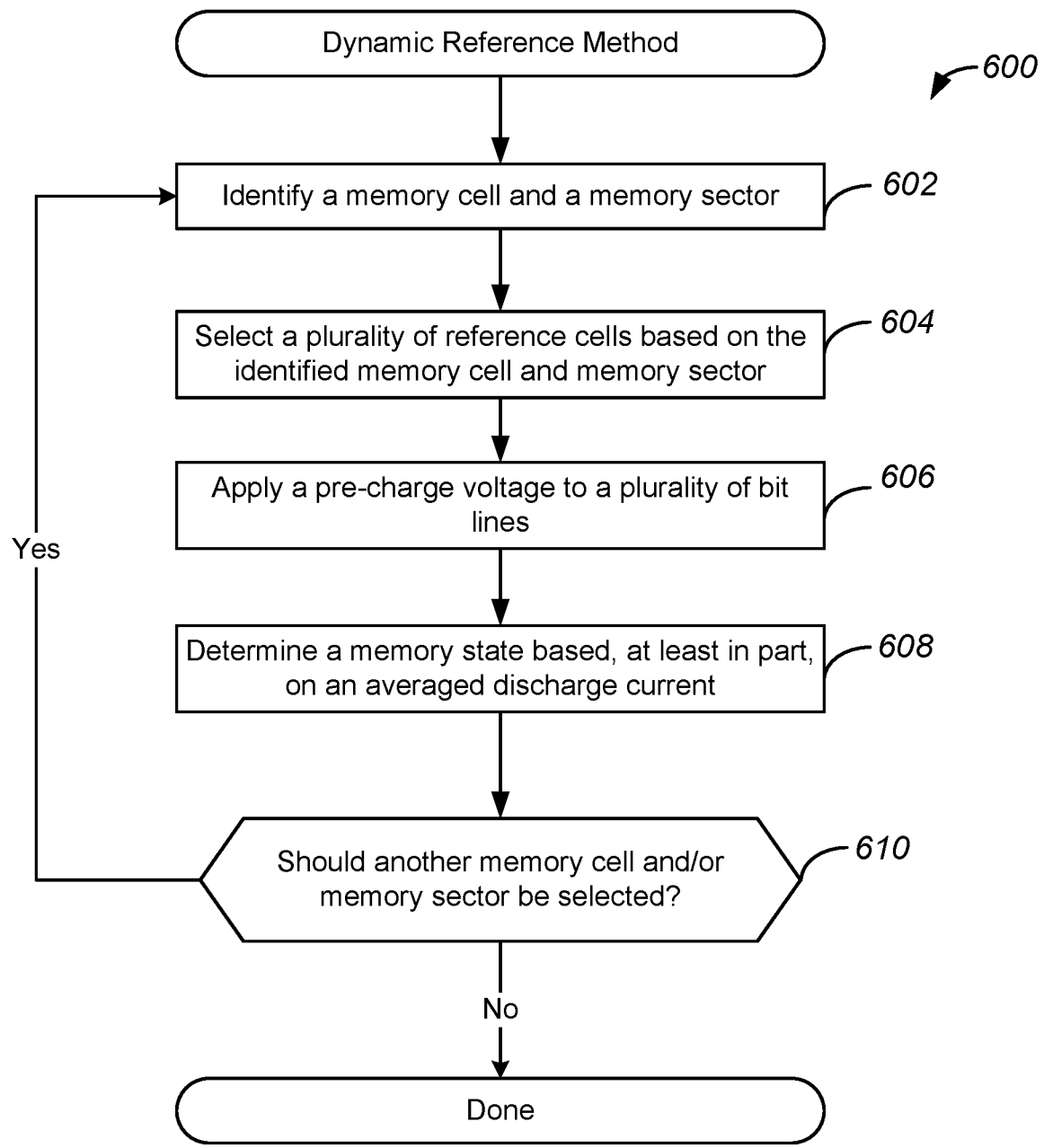
FIG. 6 illustrates an example of yet another method for dynamic sensing level determination, configured in accordance with some embodiments.

FIG. 6 illustrates an example of yet another method for dynamic sensing level determination, configured in accordance with some embodiments. As similarly discussed above, reference levels may be dynamically determined for operations performed on memory cells. Accordingly, a method, such as method 600, may be performed to identify and select particular memory sectors, and to identify reference cells within a particular memory sector. In this way, a reference level used in such sensing operations may be determined dynamically, and in a manner compatible with memory sector architectures, such as mirrored memory arrays.

Method 600 may perform operation 602 during which a memory cell and a memory sector may be identified. As similarly discussed above, the identified memory cell may be a memory cell that has been identified for a read operation or other memory operation, and may be identified as part of operation of a memory device. In one example, the memory cell may be identified based on one or more identifiers or data values included in a memory access request. Moreover, a memory sector associated with the cell may be identified. For example, a memory sector that includes the memory cell may be identified based on a designated mapping.

Method 600 may perform operation 604 during which a plurality of reference cells may be selected. In various embodiments, the reference cells may include static reference cells and dynamic reference cells coupled to a complimentary bit line as the identified memory cell and may be included in a mirrored architecture. More specifically, the memory sector identified during operation 602 may be used to identify a mirrored or complimentary memory sector, and the appropriate reference cells may be identified within the complimentary memory sector. Accordingly, the static reference cells and the dynamic reference cells may be identified based on the complimentary relationship of the cells and sectors as identified by a mapping stored in memory. As similarly discussed above, the reference cells may be used for current averaging and variance reduction of the reference values.

Method 600 may perform operation 606 during which a pre-charge voltage may be applied to a plurality of bit lines. Accordingly, a voltage may be applied to the bit lines to charge them to a predetermined voltage. As discussed above, the pre-charge voltage is a predetermined voltage that may be used for scanning operations, as well as other memory operations.

Method 600 may perform operation 608 during which a memory state may be determined based, at least in part, on an averaged discharge current and an averaged reference voltage of the plurality of static memory cells and reference cells. As similarly discussed above, the gates of the reference cells and the memory cell may be opened or activated, and the charged voltage may be discharged via the transistors underlying the reference cells and memory cell. As also discussed above, the speed with which the voltage discharges will affect an output of the sense amplifier, and provide an indication of whether or not the memory cell has a higher or lower conductance than the reference cells, and accordingly, whether or not the memory cell is in a programmed or erased state.

Method 600 may perform operation 610 during which it may be determined if another memory cell and memory sector should be selected. Accordingly, if additional memory cells should be read or scanned as part of a requested operation, they may be identified, and method 600 may return to operation 602. If no additional memory cell and memory sector should be selected, method 600 may terminate.

Figure 7:
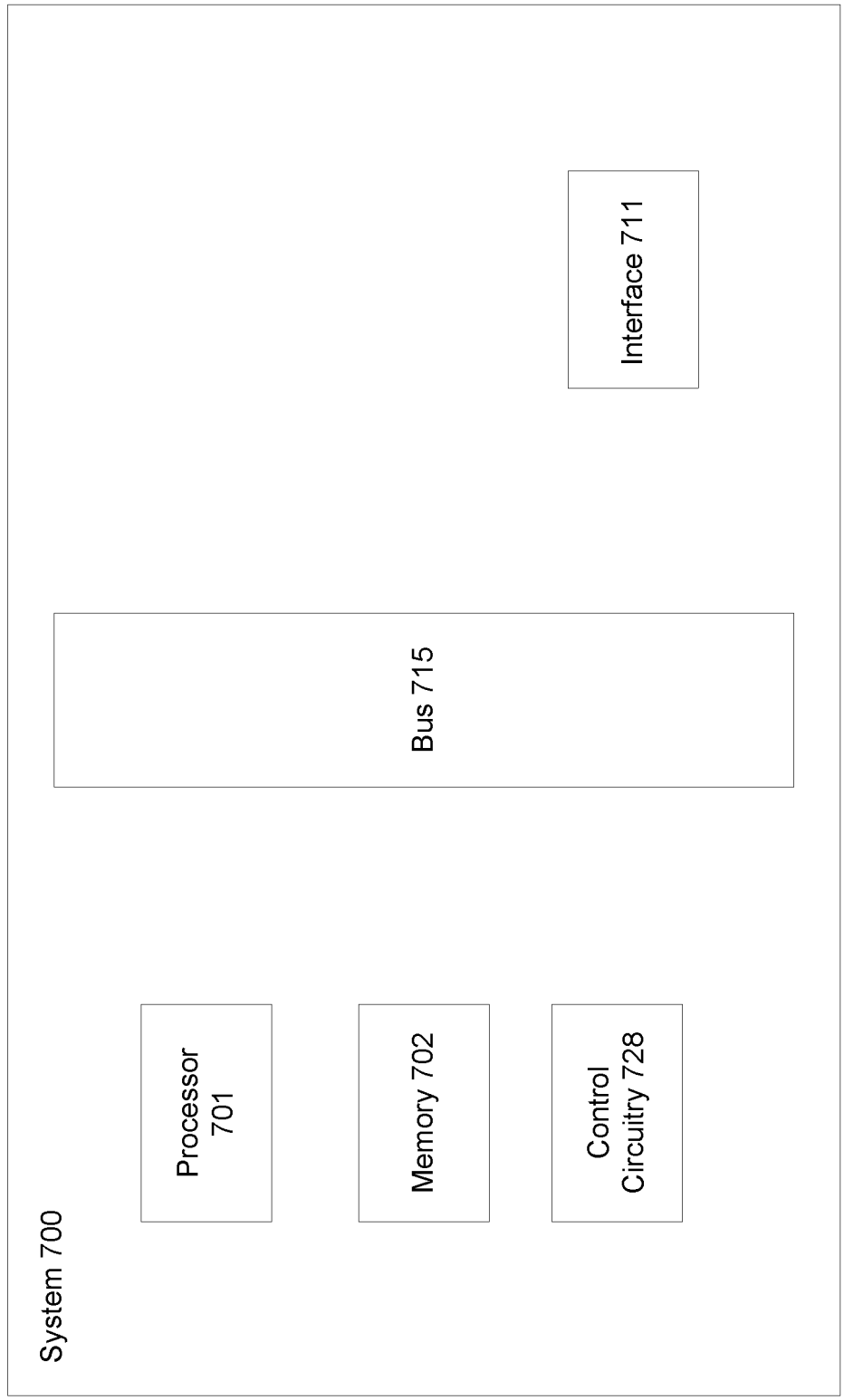
FIG. 7 illustrates an example of a system, configured in accordance with some embodiments.

FIG. 7 illustrates an example of a system, configured in accordance with some embodiments. According to particular example embodiments, system 700 may be suitable for implementing various components described above, such as device 100, device 200, and device 300. In various embodiments, system 700 may include processor 701 which may be configured to implement one or more processing operations. For example, processor 701 may be configured to implement selection and scanning operations, and may be further configured to implement memory state determination operations. System 700 may also include bus 715 which may be configured to enable communication between various components of system 700.

In various embodiments, system 700 may further include memory array 702 and control circuitry 728 which may be configured to implement aspects of the selection and scanning operations discussed above. In various embodiments, control circuitry 728 may include one or more processors and dedicated memory that may be configured to implement the previously described operations. In this way, system 700 may have a dedicated processing unit, such as control circuitry 728, which may be configured to implement the previously described selection and scanning operations. In one example, control circuitry 728 is a memory controller. Moreover, in some embodiments, control circuitry 728 may be implemented in an application specific integrated circuit (ASIC), or may be implemented in reprogrammable logic of a field programmable gate array. In some embodiments, control circuitry 728 may be implemented in a programmable system or controller that further includes a non-volatile memory, such as a Programmable System On a Chip or PSoC™ controller, commercially available from Cypress Semiconductor of San Jose, Calif. In various embodiments, one or more components of system 700 may be implemented on the same circuit die and in the same package. For example, control circuitry 728 and memory 702 may be implemented on the same circuit die. In some embodiments, they may be implemented on different dies and in different packages.

In various embodiments, communications interface 711 may be configured to send and receive data to other system components, or may be configured to send and receive packets or data segments over a network. For example, communications interface 711 may be communicatively coupled to a user interface device via a bus, such as bus 715, or via a communications network. As discussed above, communications interface 711 may be configured to receive data from such a user interface device which may be included in a data processing system or computer system. In various embodiments, such data may include data requests for applications executed by such a computer system.

Figure 8:
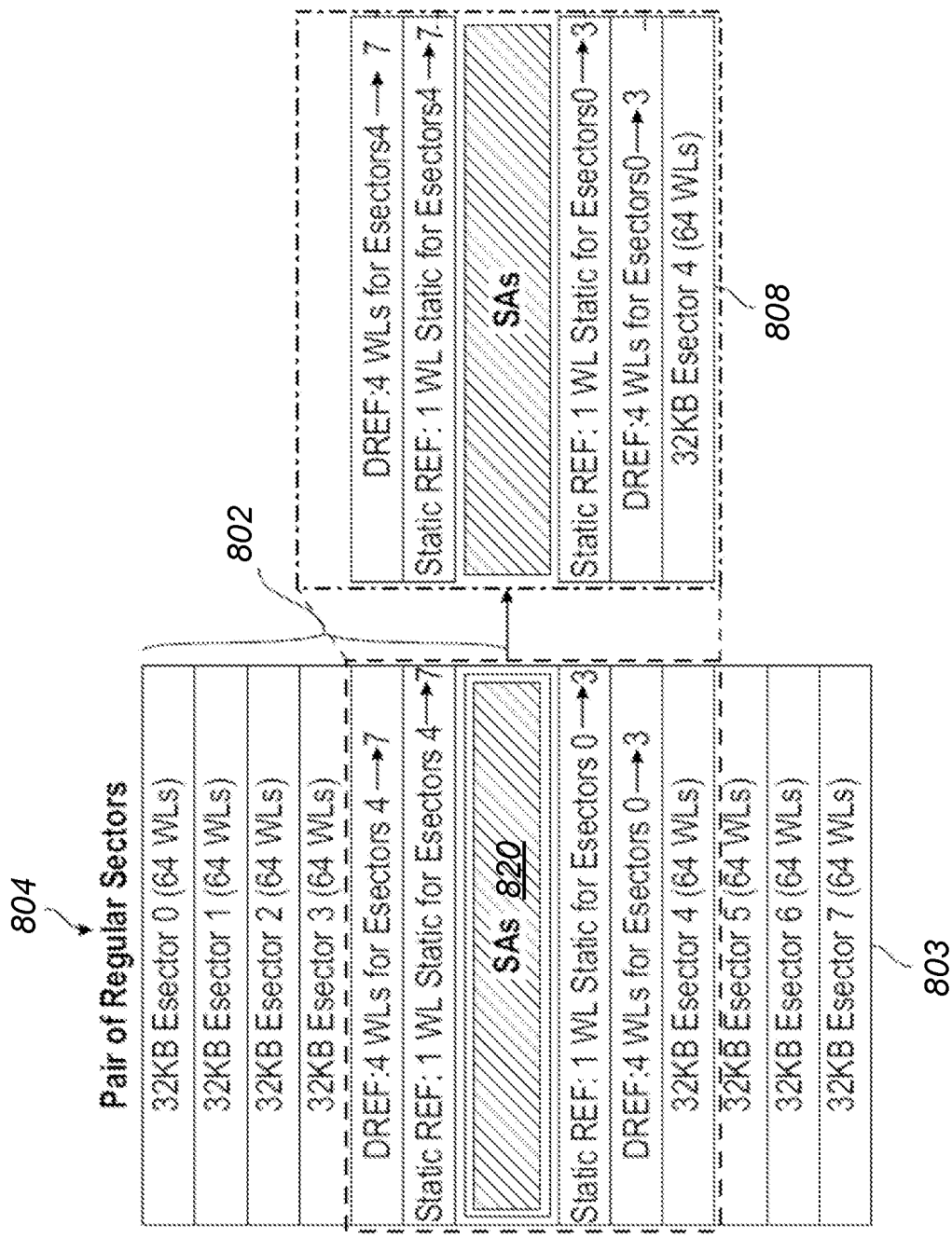
FIG. 8 illustrates an example of memory sectors included in a device for dynamic sensing level determination, configured in accordance with some embodiments.

FIG. 8 illustrates an example of memory sectors included in a device for dynamic sensing level determination, configured in accordance with some embodiments. As will be discussed in greater detail below, memory sectors may be configured to be mirrored. For example, a pair 804 of regular sectors 802 of a NOR flash memory 803, with sense amplifiers 820 generating output signals in accordance with the embodiments described above. In this example, each regular physical sector 802 includes four erase sectors, also called E-sector 808, and the pair 804 includes two regular sectors 802 sandwiching dynamic reference word lines (DREF WL), static reference word lines (Static REF WL), and sense amplifiers (SAs).

A physical sector pair 804 may contain 8 E-sectors, in one embodiment as an example. E-sectors 0-3 are mirrored to E-sectors 4-7 as shown in FIG. 8. Sensing of data located above or on one side of SAs is done relative to the other side of SAs (and vice versa). For example, memory cells in E-sector 0 are sensed using static and dynamic reference cells on the bottom or the other side of SAs. In various embodiments, selection, combination, and algorithm of combining dynamic and static reference cells are disclosed in earlier portions of this patent document.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A device comprising:
   a plurality of nonvolatile memory cells included in a plurality of memory sectors;
   a plurality of static reference cells configured to represent a first reference value for distinguishing between memory states;
   a plurality of dynamic reference cells configured to represent the first reference value after a designated amount of memory sector activity; and
   a comparator configured to be coupled to at least one memory cell of the plurality of memory cells and to at least two of the plurality of static reference cells and the plurality of dynamic reference cells, and further configured to determine a memory state of the at least one memory cell based, at least in part, on a second reference value determined based on an averaging of a combination of at least two of the plurality of static reference cells and the plurality of dynamic reference cells.

2. The device of claim 1, wherein the plurality of memory sectors is configured as mirrored erase sectors, and wherein the plurality of memory cells is coupled to a plurality of bit lines and a plurality of word lines.

3. The device of claim 2 further comprising:
   a plurality of switches configured to couple at least some of the plurality of bit lines to each other during a sensing operation.

4. The device of claim 3, wherein the sensing operation is performed on the at least one memory cell, wherein each of the at least some of the plurality of bit lines are coupled to a static reference cell, and wherein the at least some of the plurality of bit lines comprises a number of bit lines that is the same as a number of static reference cells coupled to the comparator.

5. The device of claim 4, wherein each of the at least some of the plurality of bit lines are further coupled to a dynamic reference cell in a mirrored memory sector corresponding to a memory sector of the at least one memory cell.

6. The device of claim 5, wherein at least one of the dynamic reference cells coupled to the at least some of the plurality of bit lines are in a fully erased or partially erased state.

7. The device of claim 5, wherein the dynamic reference cell has a partially programmed or fully programmed reference value.

8. The device of claim 1, wherein the second reference value is determined based on a capacitive averaging of discharge currents through the combination of the at least some of the plurality of static reference cells and the plurality of dynamic reference cells.

9. The device of claim 8, wherein the combination comprises two or more pairs of static reference cells and dynamic reference cells.

10. The device of claim 8, wherein the capacitive averaging is configured to reduce a variance of the first reference value represented by the at least some of the plurality of static reference cells and the plurality of dynamic reference cells.

11. A method comprising:
    identifying a memory cell of a plurality of memory cells included in a plurality of memory sectors;
    selecting, using a plurality of switches, a plurality of reference cells associated with the memory cell comprising at least two of a plurality of static reference cells and a plurality of dynamic reference cells;
    determining a reference value based on an averaging of a combination of the at least two of the plurality of static reference cells and the plurality of dynamic reference cells; and
    determining, using a comparator, a state of the memory cell based, at least in part, on the reference value.

12. The method of claim 11, wherein the combination of the at least two of the plurality of static reference cells and the plurality of dynamic reference cells are included in a mirrored erase sector corresponding to a memory sector of the identified memory cell.

13. The method of claim 11, wherein the identifying of the memory cell is included in a sensing operation performed, at least in part, by a sense amplifier.

14. The method of claim 11, wherein the reference value is determined based on a capacitive averaging of discharge currents through the combination of the at least two of the plurality of static reference cells and the plurality of dynamic reference cells.

15. The method of claim 14, wherein the combination comprises two or more pairs of static reference cells and dynamic reference cells.

16. The method of claim 14, wherein the capacitive averaging reduces a variance of a reference voltage represented by the at least some of the plurality of static reference cells and the plurality of dynamic reference cells.

17. A method comprising:
    identifying a memory cell of a plurality of memory cells included in a plurality of memory sectors;
    coupling the memory cell to a comparator;

selecting, using a plurality of switches, a plurality of reference cells comprising at least two of a plurality of static reference cells and a plurality of dynamic reference cells;

coupling the plurality of reference cells to the comparator;

applying a pre-charge voltage to a plurality of bit lines coupled to the memory cell and the plurality of reference cells;

discharging the pre-charge voltage through the memory cell and the plurality of reference cells; and determining, using the comparator, a state of the memory cell based, at least in part, on a result of the discharging and an averaging of the discharging through the plurality of reference cells.

18. The method of claim 17, wherein the at least two of the plurality of static reference cells and the plurality of dynamic reference cells are included in a mirrored erase sector corresponding to a memory sector of the identified memory cell.

19. The method of claim 17, wherein the discharging further comprises:

generating discharge currents through the plurality of reference cells, wherein the discharge currents are capacitively averaged.

20. The method of claim 19 further comprising:

determining a reference value based on the discharge currents.

* * * * *